United States Patent [19]

Brooks et al.

[11] Patent Number: 5,351,415
[45] Date of Patent: Oct. 4, 1994

[54] METHOD AND APPARATUS FOR MAINTAINING CLEAN ARTICLES

[75] Inventors: Ray G. Brooks; Timothy W. Brooks, both of Irving, Tex.; C. James Corris, Elkmont, Ala.

[73] Assignee: Convey, Inc., Irving, Tex.

[21] Appl. No.: 884,411

[22] Filed: May 18, 1992

[51] Int. Cl.$^5$ .............................................. F26B 7/00
[52] U.S. Cl. ...................................... 34/389; 361/213; 34/60; 34/404; 141/85
[58] Field of Search ................. 34/22, 23, 15, 17, 18, 34/60, 12; 134/1; 361/212, 213; 141/85; 432/56, 11, 152, 253; 206/328, 454, 455

[56] References Cited

U.S. PATENT DOCUMENTS 4,132,567  1/1979  Blackwood .......................... 134/1

*Primary Examiner*—Henry A. Bennett
*Attorney, Agent, or Firm*—Timmons & Kelly

[57] ABSTRACT

A method, system and apparatus for maintaining articles to be processed clean, having an airtight transportable container with an inlet valve for admitting ionized gas and an outlet valve for venting gas, a purger with an interface to the container inlet valve and a vacuum pick-up and ionized gas spray wand is disclosed. A purger rack for storing multiple containers is also disclosed.

42 Claims, 10 Drawing Sheets

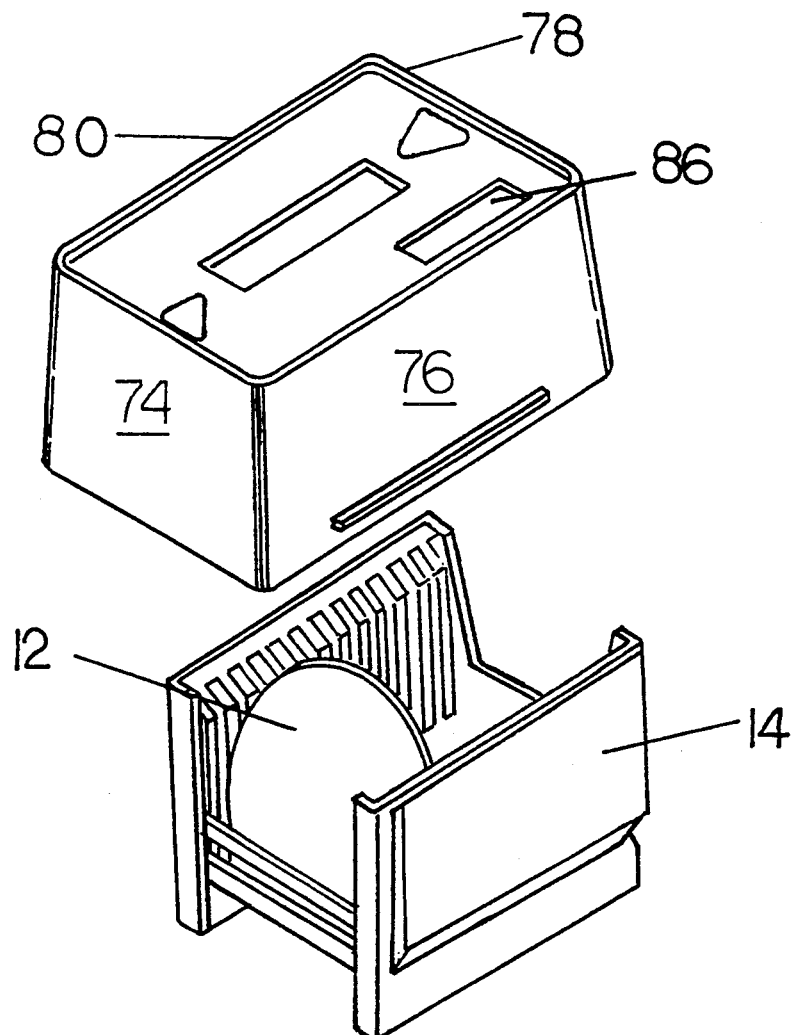
FIG.4
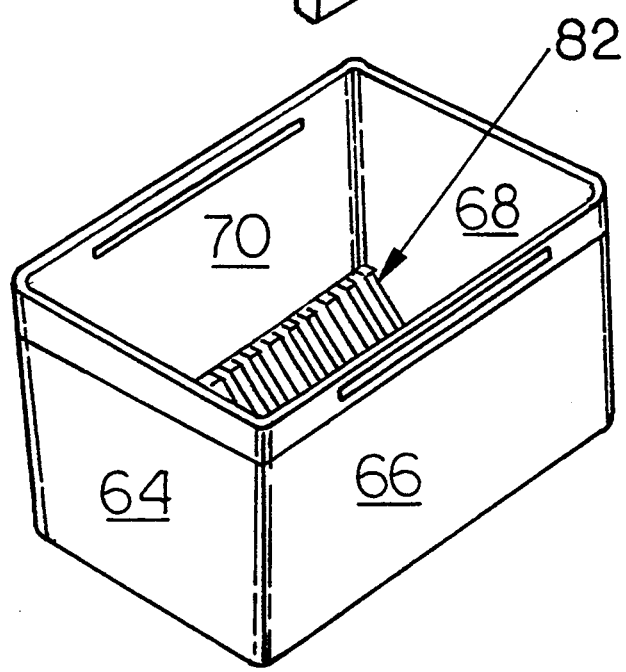

METHOD AND APPARATUS FOR MAINTAINING CLEAN ARTICLES

BACKGROUND OF THE INVENTION

1. Technical Field

The present invention relates generally to apparatus, systems and methods for reducing particle contamination for workpieces in a clean room environment or mini-environment and for transportation and storage of such workpieces. In one of its aspects, the present invention relates to a clean mini-environment for processing semiconductor wafers and transferring semiconductor wafers between locations.

2. Description of the Related Art

In an effort to reduce particulate contamination in clean environment processing of semiconductor wafers, Hewlett-Packard Company developed a standardized mechanical interface (SMIF) which is made up of enclosed portable containers known as "pods" and clean process equipment canopy as shown in U.S. Pat. Nos. 4,532,970 and 4,534,389. The wafers are placed in a pod to be carried from one process to another or to simply wait for processing. It was intended that the air or other gas surrounding the wafers inside of the pod would be stationary in order to reduce the number of particles in motion which might come into contact with one of the wafers. A pod filled with wafers is placed underneath a canopy next to a piece of equipment which performs some processing step. The canopy is closed, the pod is then opened and the wafers are removed by a mechanical arm. When the process is over, the wafers are returned to the pod. A human then opens the canopy and removes the pod. No human has touched the wafers themselves. Typically, a clean process canopy will also have a HEPA filter and an air handler so that the environment underneath the canopy is cleaner than that of the clean room.

The use of SMIF pods and hooded environments has left some problems unresolved. Their use has been an attempt to keep the semiconductor wafers as clean as possible, but they do not help remove particulates or static charge which do become associated with the wafers. This led to the development of a container which employed active filtering of the air inside the container as shown in U.S. Pat. No. 4,724,874. This departed from the original SMIF concept of trying to keep that air as still as possible. The '874 patent also shows the use of an injector/extractor for alternatively evacuating and pressurizing the interior space through a filter. It also discloses a closed recirculation system in which clean air or free $N_2$ may be added.

SUMMARY OF THE INVENTION

A system for maintaining articles to be processed clean according to the present invention includes a boat for supporting the articles in an organized upright arrangement, a box for receiving the boat with the articles, a cover for the box forming an airtight container, an inlet valve in the box for admitting a gas such as purified ionized air or nitrogen into the container, and an outlet valve for venting gas from the container. A purger forms an interface for the container inlet valve. When the container is in place on the interface, gas is admitted into the container from a gas supply through the purger and the inlet valve. In one arrangement, a plurality of such purgers are arranged in an array, forming a rack for storage of a plurality of such containers.

In one arrangement, a static charge monitor is located inside the container when the container is operably connected to the purger. A circuit within the purger is operably connected to the static charge monitor when the container is operably connected to the purger for monitoring the static charge within the container. A second static charge monitor is adjacent to the exterior surface of the container to monitor the condition of the antistatic material which is blended into the container walls. A circuit within the purger is also operably connected to the second static charge monitor for monitoring its condition. In the arrangement with a plurality of purgers for storage of a plurality of containers, gas will be turned on to enter the inlet valve of a particular container when the internal static charge monitor indicates that the charge inside of that container is above a predetermined level.

In a preferred arrangement, the box forms a generally rectangular bottom and four substantially upright, generally rectangular walls and the cover forms a generally rectangular top and four substantially upright, generally rectangular walls which mate with the four walls of the box to form a closed structure. The gas inlet valve is in the bottom and extends substantially the length of the bottom in order to distribute the gas coming through the inlet valve reasonably evenly over the articles in the boat.

In one arrangement, electronic storage such as a semiconductor chip having random access memory is affixed to the container in order to store historic data about the container and its contents.

A vacuum pick-up and gas spray apparatus according to the present invention includes a paddle forming a substantially flat surface for placing against an article to be picked up, a suction source such as a vacuum pump, a suction nozzle adjacent to the paddle and open to the flat surface, operably connected to the suction source such as through a flexible hose, a source for a gas such as nitrogen or purified air which could be ionized and a gas nozzle operably connected to the gas source such as through a flexible hose. The gas nozzle is positioned for spraying the gas across the side of the paddle having the substantially flat pick-up surface so that the purifying gas can be sprayed over the surface of an article being lifted by the apparatus.

In a preferred arrangement, the vacuum pick-up and spray apparatus includes a housing suitable for being held in a user's hand, a voltage source outside of the housing with an output voltage small enough to not present risk of serious harm to a user, an electric circuit located within the housing operably connected to the low voltage source for generating a high positive voltage and a high negative voltage, and a pair of electrodes within the housing, one connected to the high positive voltage and the other connected to the high negative voltage. The gas is ionized by the corona caused by the high voltage on the electrodes as it passes over them.

In one arrangement of the vacuum pick-up and gas spray apparatus, a vacuum sense switch is responsive to the suction level between the suction source and the suction nozzle. The vacuum sense switch has a first position corresponding to a suction level when an article is currently picked up and a second position corresponding to a suction level when no article is picked up. A manual switch is located on the housing for convenient control by the user. It has at least a first position and a second position. A suction control valve is operably connected between the suction source and the suction nozzle. It is responsive to both the vacuum switch and the manual switch, being open when either the vacuum sense switch or the manual switch in the first position and closed, actually venting or exhausting the vacuum, when both the vacuum sense switch and the manual switch are in the second position. A gas control valve is operably connected between the gas source and the gas nozzle. The gas control valve is responsive to the vacuum sense switch and the manual switch. The gas control valve is open when the vacuum sense switch is in the first position or the manual switch is in the first position. It is closed when both switches are in the second positions.

A method according to the present invention for transferring semiconductor wafers from a first location to a second location in an airtight container includes lifting each wafer by the vacuum pick-up and gas spray apparatus and placing it into the box while spraying at least one surface of the wafer with ionized gas, then placing the cover onto the box, forming the airtight container and admitting ionized gas into the container while releasing gas from the container. The container is thus substantially purged of static charge in addition to airborne or gaseous contaminates and particulates. The method also includes then collecting and storing data regarding the container and the wafers, and transferring the container to the second location. Once the airtight container is at the second locations the stored data regarding the container and the wafers is read, and ionized gas is admitted into the container while gas is released from the container, once again substantially purging the container of static charge, and airborne or gaseous contaminates and particulates. The cover is then removed from the box, and each wafer is lifted from the box by a vacuum pick-up device and placed at the second location while spraying ionized gas over at least one of its surfaces.

One method according to the present invention includes transferring the container to a storage area, such as the storage rack of this invention, prior to transferring it to the second location, and periodically admitting ionized gas into the container while releasing gas from the container while it is in the storage area.

These and other objects, advantages and features of the invention will be apparent from the following description taken with reference to the accompanying drawing, wherein is shown the preferred embodiments of the invention.

BRIEF DESCRIPTION OF THE DRAWING

FIG. 4 is a partially exploded view of a transportable container according to the present invention along with an article to be processed and a boat for supporting the article;

DESCRIPTION OF THE PREFERRED EMBODIMENTS

Figure 1:
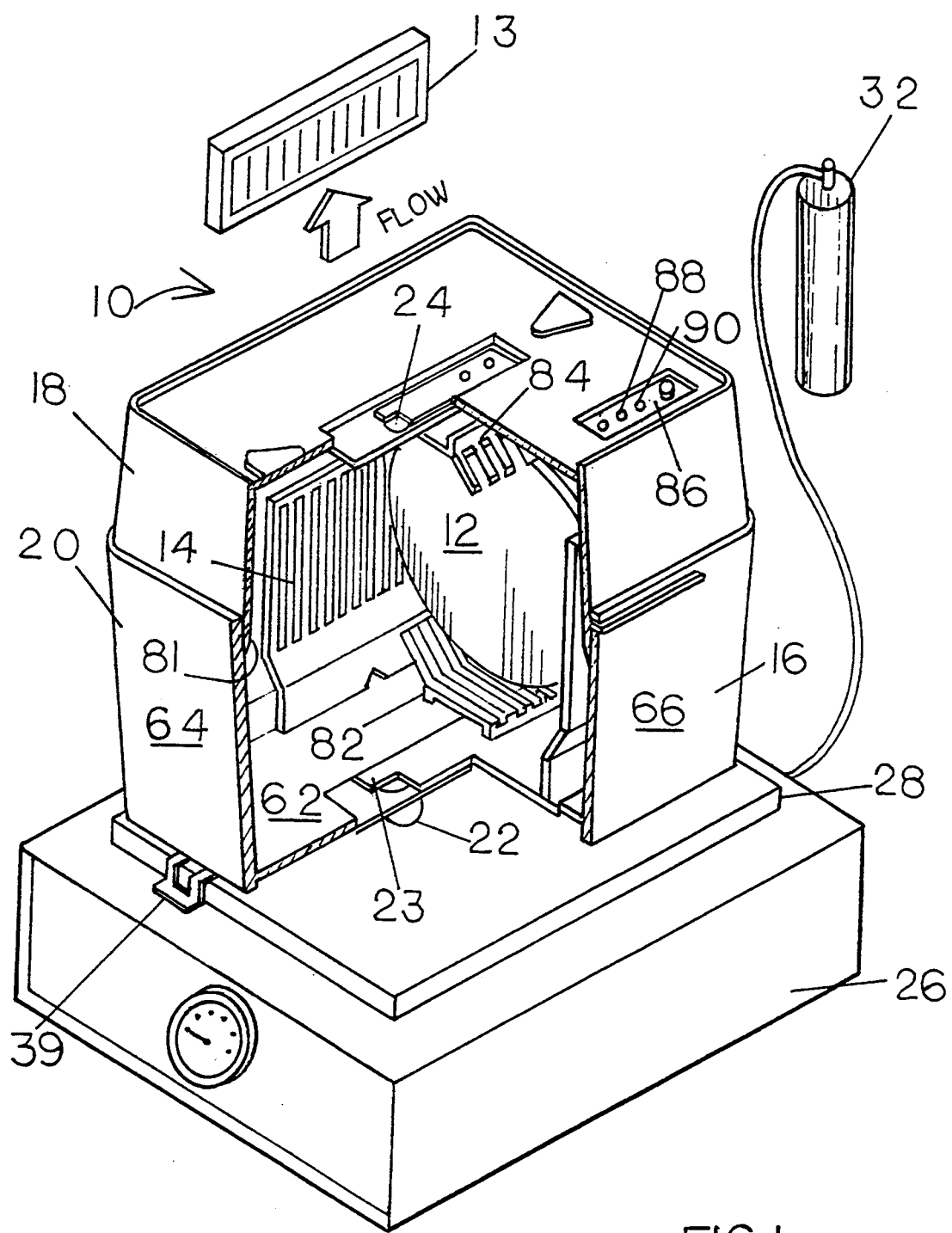
FIG. 1 is a perspective view in partial cut away of a system according to the present invention along with an article to be processed.
Figure 2:
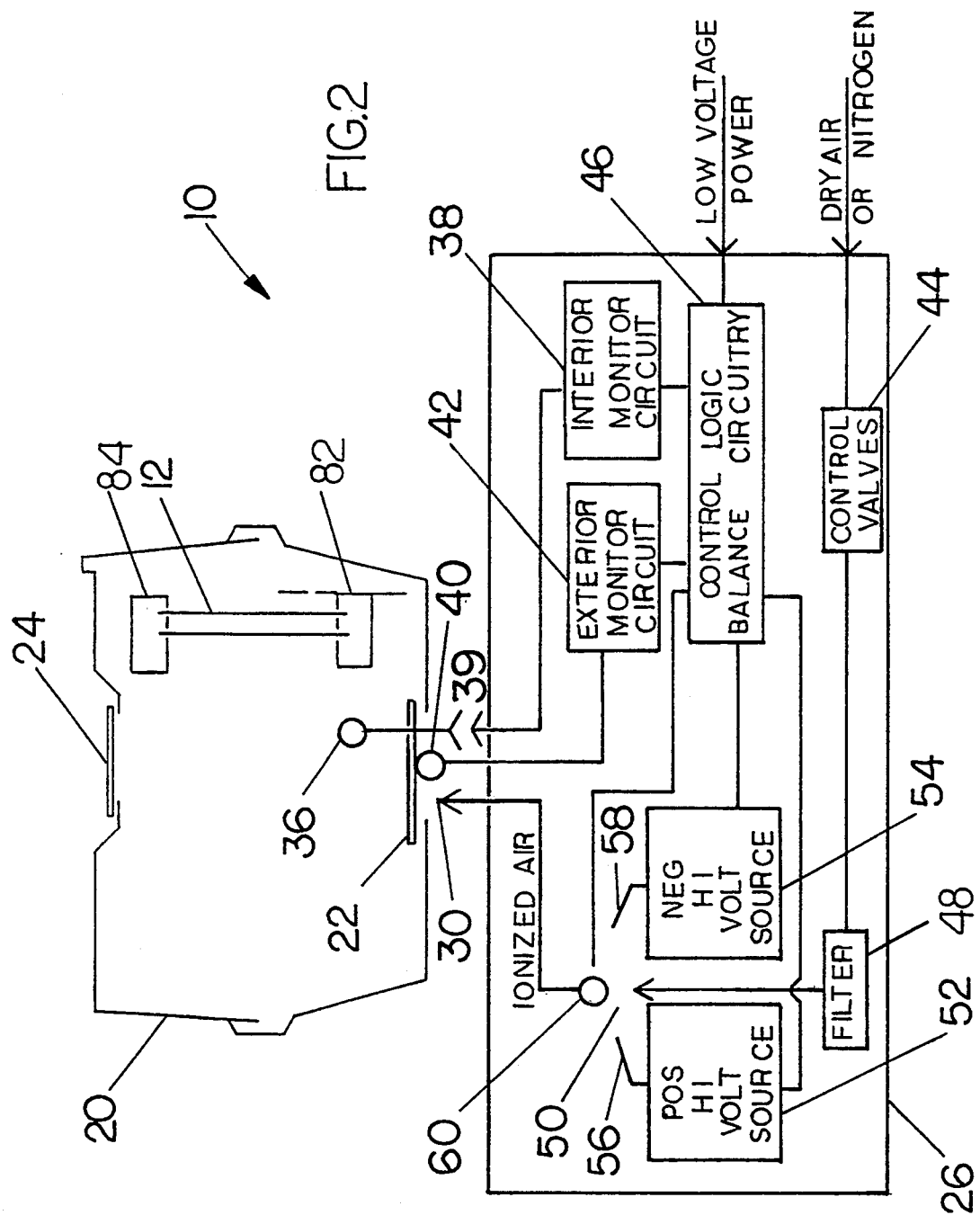
FIG. 2 is a diagrammatic view of the system of FIG. 1.
Figure 3:
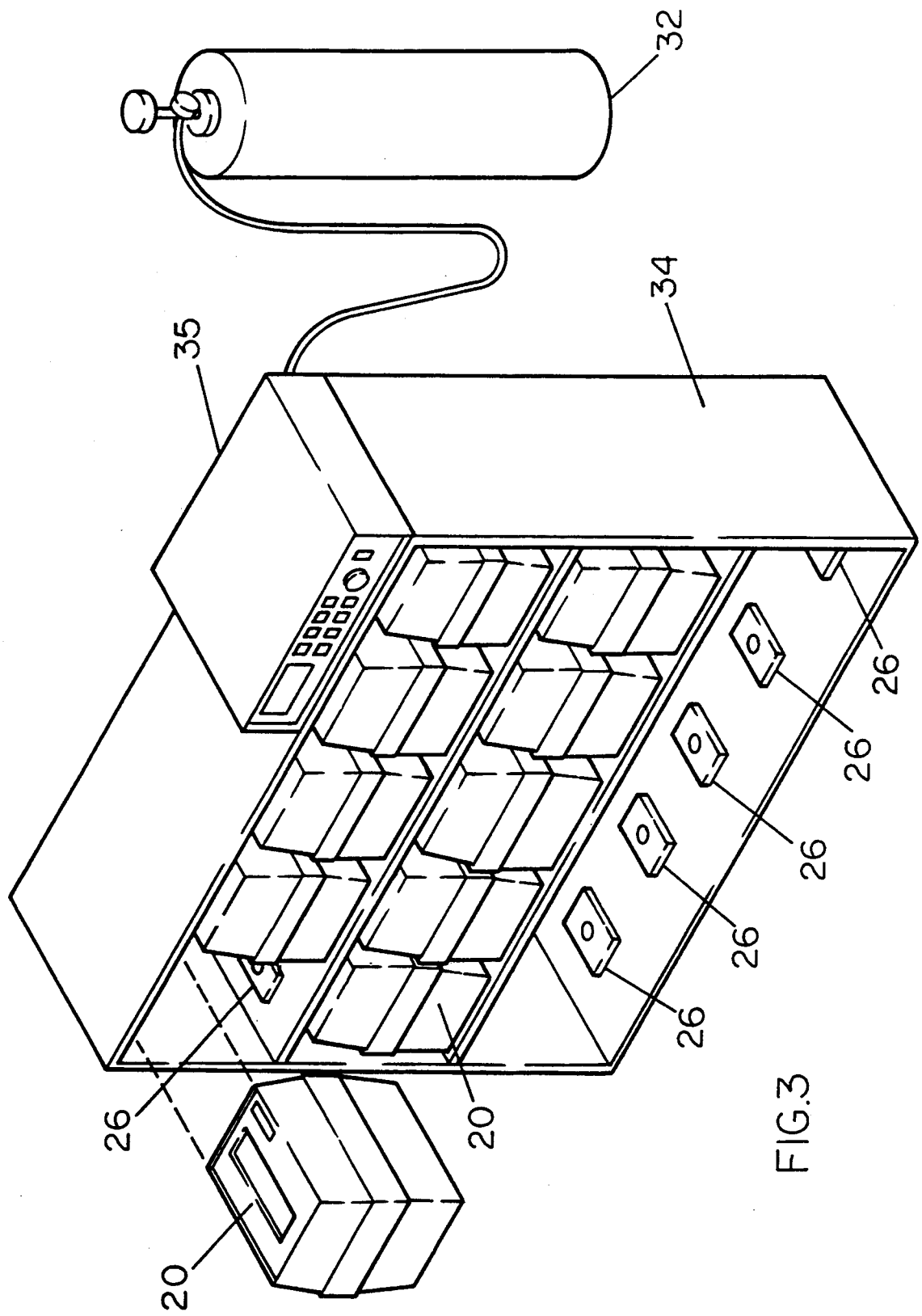
FIG. 3 is a perspective view of another system according to the present invention.

Referring now to the drawing, and in particular to FIG. 1 and FIG. 2, a system for maintaining articles 12, such as wafers to manufacture semiconductor chips, to be processed clean according to the present invention is referred to generally by reference numeral 10. Normally, such processing would still take place in a clean room equipped with "HEPA" filters 13 or the equivalent. System 10 includes a boat 14 for supporting articles 12 in an organized upright arrangement, a box 16 for receiving boat 14 with the articles, a cover 18 for mating with the box and forming an airtight container 20, an inlet valve 22 with appropriate seating in the box for admitting a gas such as nitrogen or purified air which can be ionized into the container, and an outlet valve 24 with appropriate seating for venting gas from the container. A purger 26 forms an interface 28 for container inlet valve 22. Interface 28 can be nothing more than an insulating surface with a gas outlet 30 to mate with gas inlet valve 22. When container 20 is in place on interface 28, gas is admitted into the container from a gas supply 32 through purger 26 and the inlet valve. Referring also to FIG. 3, in one arrangement, a plurality of such purgers are arranged in an array on rack 34 for storage of a plurality of such containers.

In one arrangement, a static charge monitor 36 is located inside container 20 when the container is operably connected to purger 26. A circuit 38 within the purger is operably connected to the static charge monitor when the container is operably connected to the purger, for monitoring the static charge within the container. This connection is made through connector 39 in the embodiment illustrated, but static charge monitor 36 could be directly connected to circuit 38 and inserted into a container when the container is placed on the interface. A second static charge monitor 40 is adjacent to the exterior surface of container 20 to monitor the condition of the antistatic material which is blended into the container walls. A circuit 42 within the purger is operably connected to second static charge monitor 40 for monitoring its condition. In the arrangement with a plurality of purgers for storage of a plurality of containers, gas will be turned on to enter the inlet valve of a particular container when the internal static charge monitor indicates that the static charge inside of that container is above a predetermined level. This is accomplished by a control valve 44 which regulates the amount of gas reaching gas outlet 30. Control valve 44 is controlled by a control logic and balance circuit 46 in response to monitor circuits 38 and 40. Gas which passes through control valve 44 also passes through a filter 48 and an ionizing chamber 50. A circuit 52 for generating a high positive voltage and a circuit 54 for generating a high negative voltage create a high voltage coronas at electrodes 56 and 58, which ionizes the gas passing through chamber 50. An ionization balance sensor 60 provides feedback to control logic and balance circuit 46 about the state of ionization in the chamber.

In the arrangement of rack 34, a computer 35 monitors the sensors associated with each container 20 in order to know when it is necessary to purge a container with ionized gas. In a simpler arrangement, computer 35 can simply be a program controller which periodically purges the containers on a schedule.

Referring also to FIG. 4, in a preferred arrangement, box 16 forms a generally rectangular bottom 62 and four substantially upright, generally rectangular walls 64, 66, 68 and 70. Cover 18 forms a generally rectangular top 72 and four substantially upright, generally rectangular walls 74, 76, 78 and 80 which mate with the four walls of the box to form a closed structure. A seal 81 is formed between the box and the cover where the four walls of the cover mate with the four walls of the box to form an airtight structure. Gas inlet valve 22 is in bottom 62 and its interior inlet plate 23 extends substantially the length of the bottom in order to distribute the gas coming through the inlet valve reasonably evenly over the articles in the boat. Distribution bar 82 also aids in even distribution and serves as a lower shock absorber. An upper distribution bar 84 acts as an upper shock absorber.

In one arrangement, electronic storage such as a semiconductor chip 86 having random access memory is affixed to the container in order to store historic data about the container and its contents. The data on chip 86 can be accessed through terminals 88 and 90.

Figure 5:
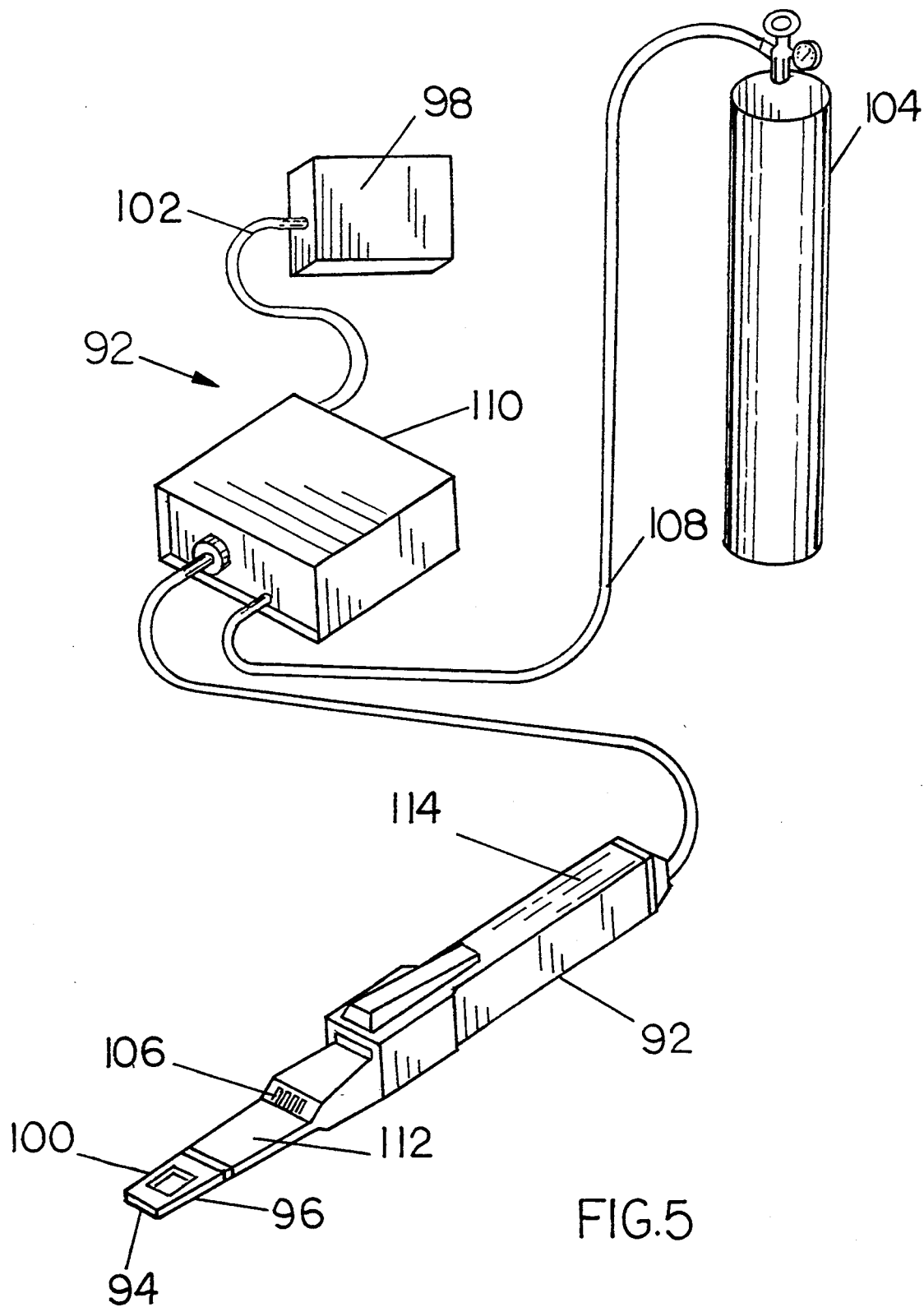
FIG. 5 is a pictorial representation of a vacuum pick-up and gas spray apparatus according to the present invention.
Figure 6:
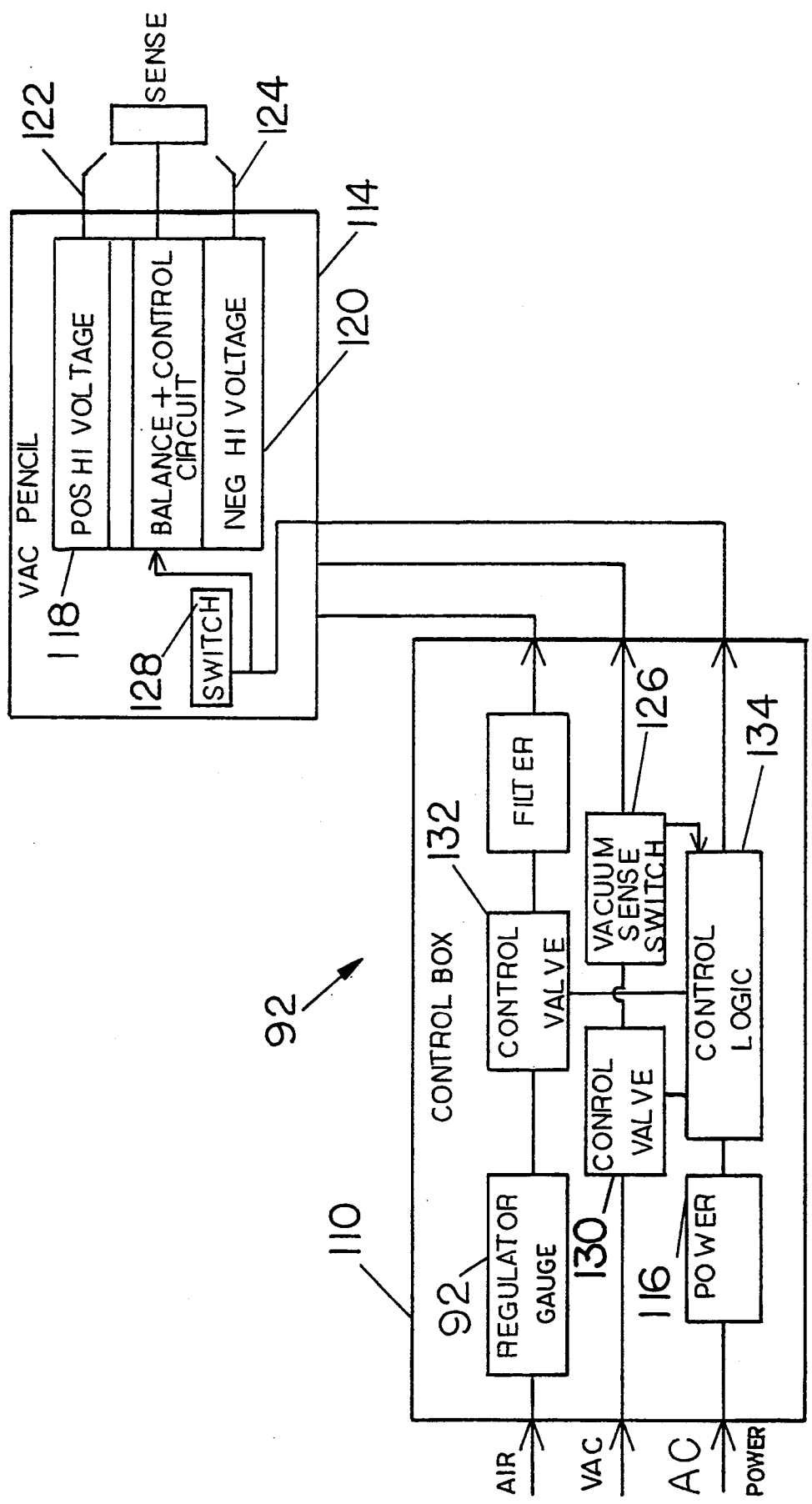
FIG. 6 is a block diagram representation of the vacuum pick-up and gas spray apparatus of FIG. 5.
Figure 7:
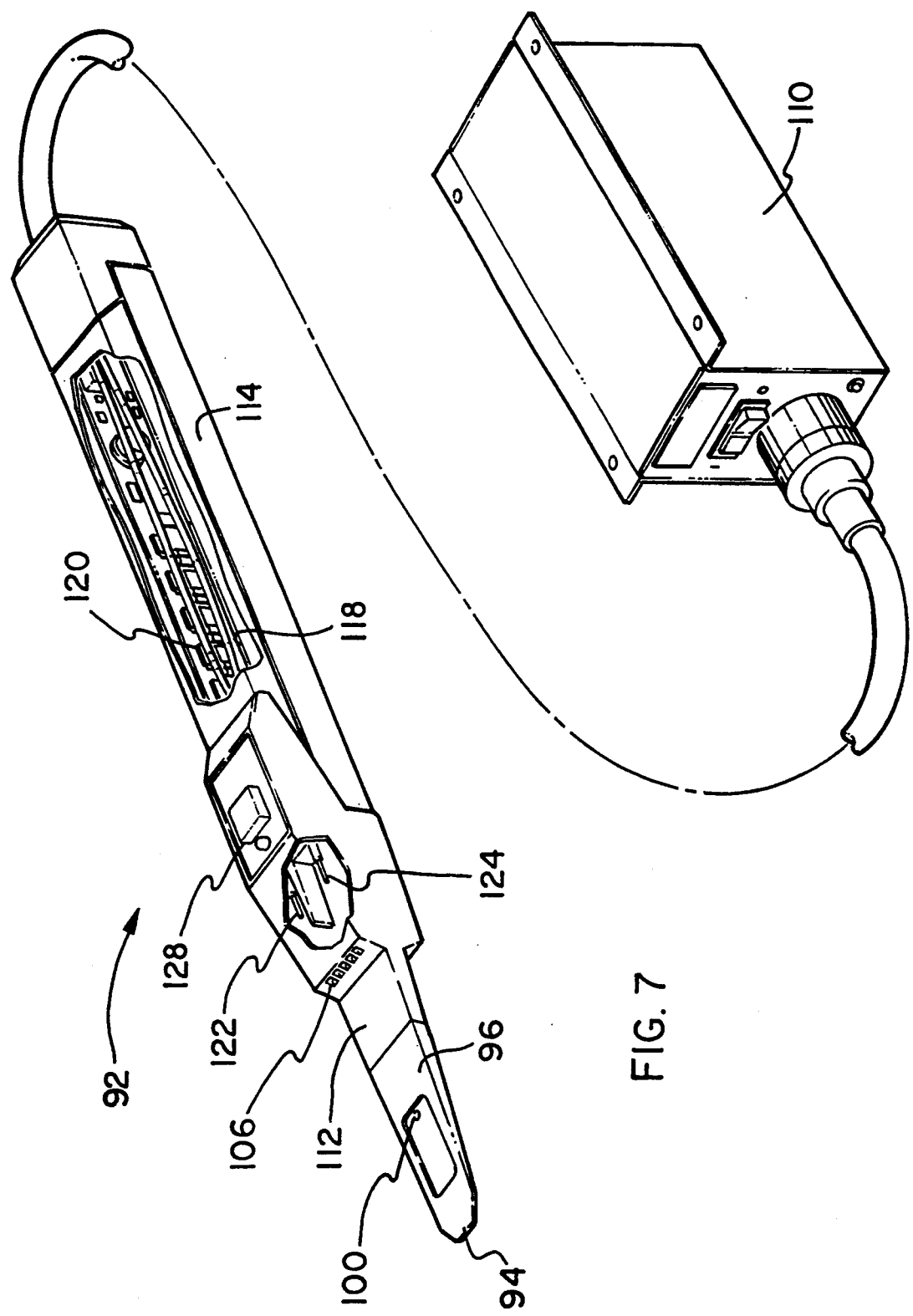
FIG. 7 is a partially cut away pictorial representation of the vacuum pick-up and gas spray apparatus of FIG. 5 showing the inside of the vacuum pencil and control box.

Referring now to FIG. 5, FIG. 6 and FIG. 7, a vacuum pick-up and gas spray apparatus 92 according to the present invention includes a paddle 94 forming a substantially flat surface 96 for placing against an article to be picked up, a suction source 98 such as a vacuum pump, a suction nozzle 100 located in an opening or recess 101 in the paddle and open to flat surface 96, operably connected to the suction source such as through a flexible hose 102, a source 104 for a gas such as nitrogen or purified air which could be ionized and a gas nozzle, in the case illustrated ports 106 operably connected to the gas source such as through a flexible hose 108. The flexible hoses 102 and 108 are connected to their respective nozzles through a control box 110. Gas nozzle 106 is positioned for spraying the gas across the side 112 of paddle 94 having substantially flat pick-up surface 96 so that the purifying gas can be sprayed over the surface of an article being lifted by the apparatus.

Figure 8:
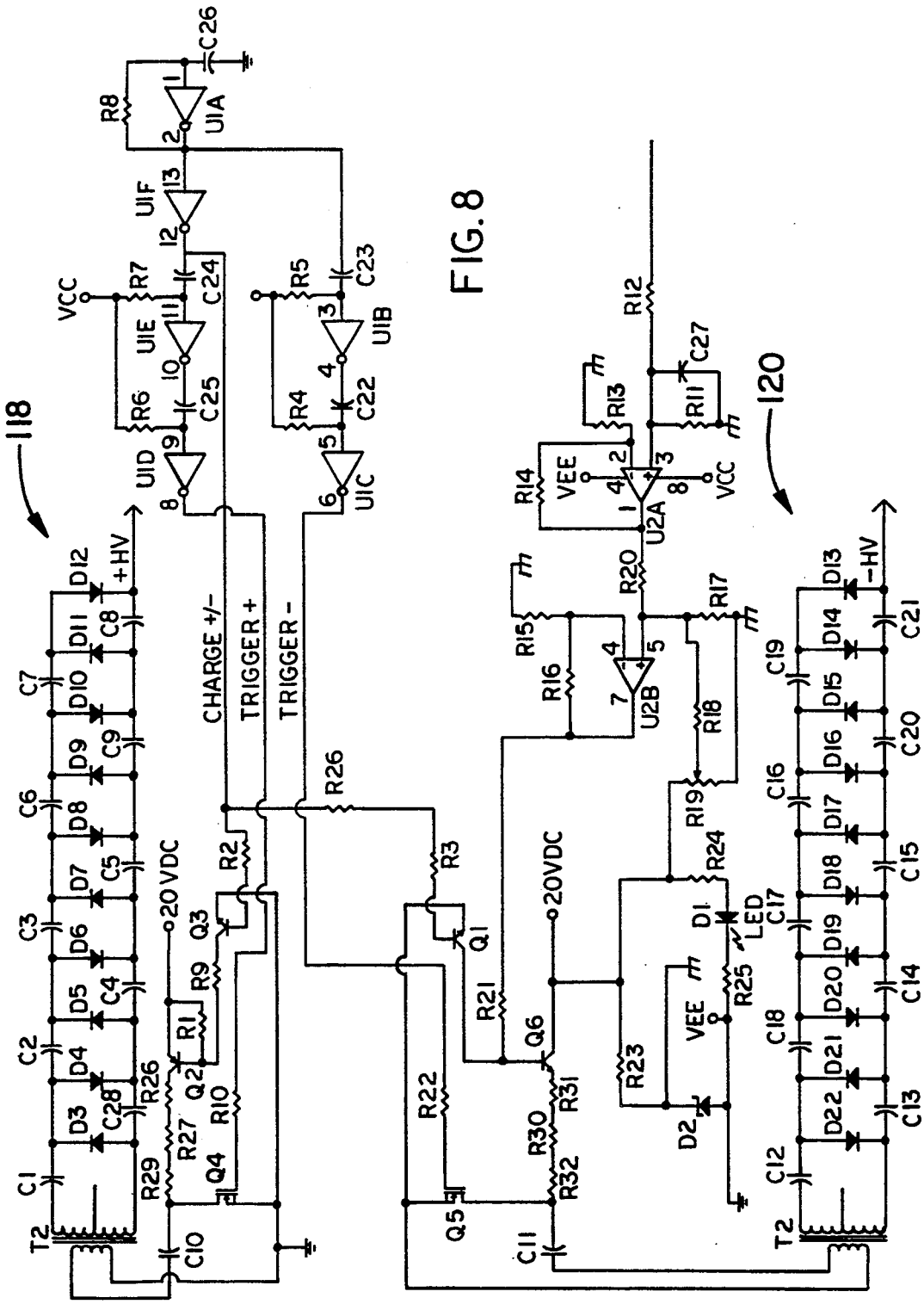
FIG. 8 is a schematic diagram of one electrical circuit for the vacuum pick-up and gas spray apparatus of FIG. 5.
Figure 9:
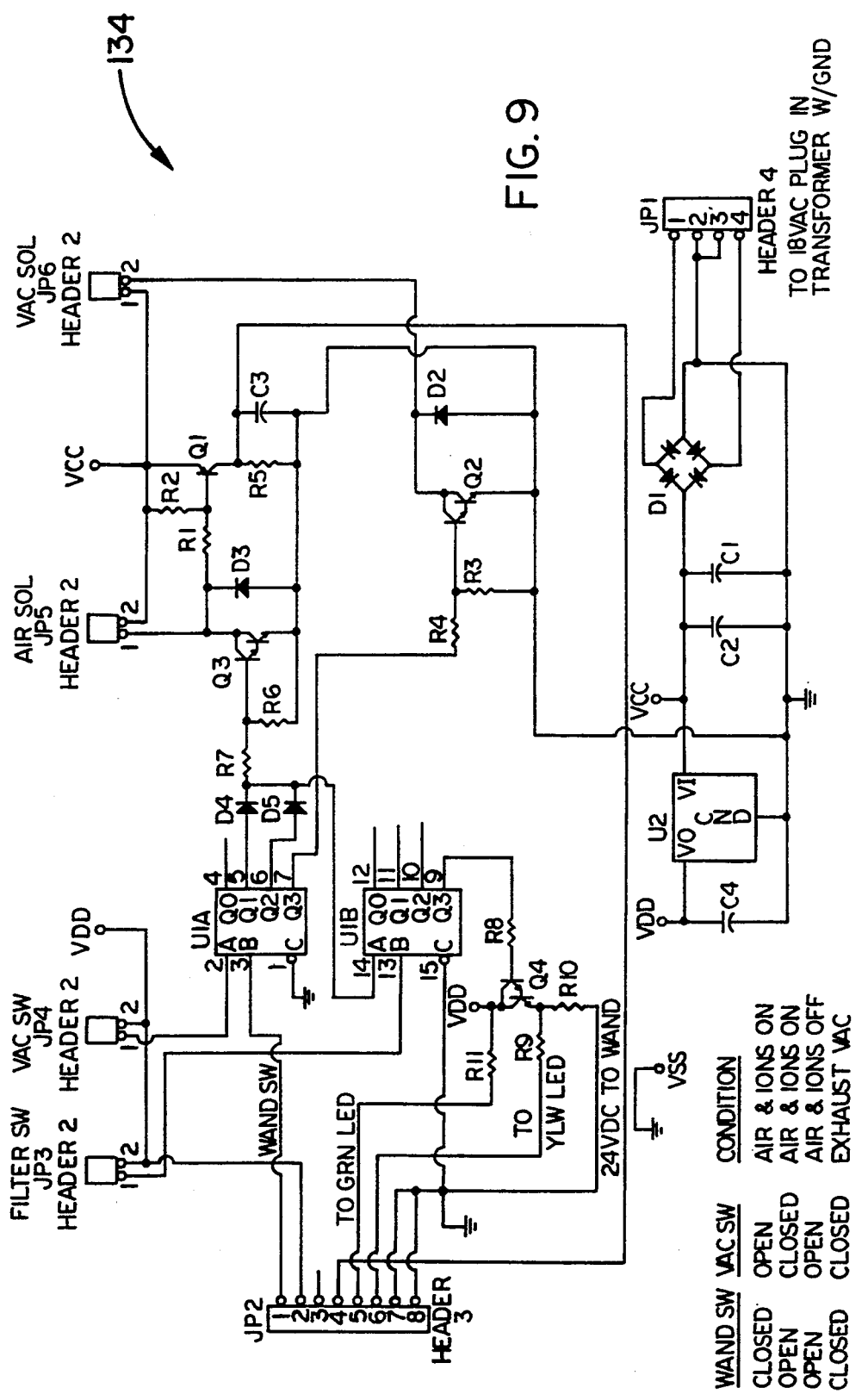
FIG. 9 is a schematic diagram of one electrical circuit for the control logic of the vacuum pick-up and gas spray apparatus of FIG. 5.

Referring also to FIG. 8 and FIG. 9, in a preferred arrangement, the vacuum pick-up and spray apparatus 92 includes a housing 114 forming a "vacuum pencil" suitable for being held in a user's hand, a power source 116 located outside of the housing with an output voltage small enough to not present risk of serious harm to a user, an electric circuit 118 located within the housing operably connected to the low voltage power source for generating a high positive voltage and a circuit 120 located within the housing operably connected to the low voltage power supply for generating a high negative voltage, and a pair of opposing electrodes 122 and 124 forming an ionizing chamber 125 within the housing, one connected to the high positive voltage and the other connected to the high negative voltage. The gas passes the two electrodes in travelling from the gas source to the gas nozzle. The gas is ionized by the corona caused by the high voltage on the two electrodes as it passes over them. An ionization chamber filter 115 filters the gas entering ionization chamber 125.

In one arrangement of vacuum pick-up and gas spray apparatus 92, a vacuum sense switch 126 is responsive to the suction level between suction source 98 and suction nozzle 100. The vacuum sense switch has a first position corresponding to a suction level when no article is currently picked up and a second position corresponding to a suction level when an article is picked up. A manual switch 128 is located on housing 114 for convenient control by the user. It has at least a first position and a second position. A suction control valve 130 is operably connected between suction source 98 and suction nozzle 100. It is responsive to both vacuum sense switch 126 and manual switch 128, being open when either the vacuum sense switch or the manual switch in the first position and closed when both the vacuum sense switch and the manual switch are in the second position. A gas control valve 132 is operably connected between gas source 104 and gas nozzle 106. The gas control valve is responsive to vacuum sense switch 126 and manual switch 128. The gas control valve is open when the vacuum sense switch is in the second position or the manual switch is in the second position. It is closed when both switches are in the first positions. Such switching can be controlled through separate control logic 134. A summary table for these switch settings is:

| manual switch | vacuum switch | gas spray | vacuum |
| --- | --- | --- | --- |
| second pos. | first pos. | on | on |
| first pos. | second pos. | on | on |
| first pos. | first pos. | off | on |
| second pos. | second pos. | on | exhaust |

Figure 10:
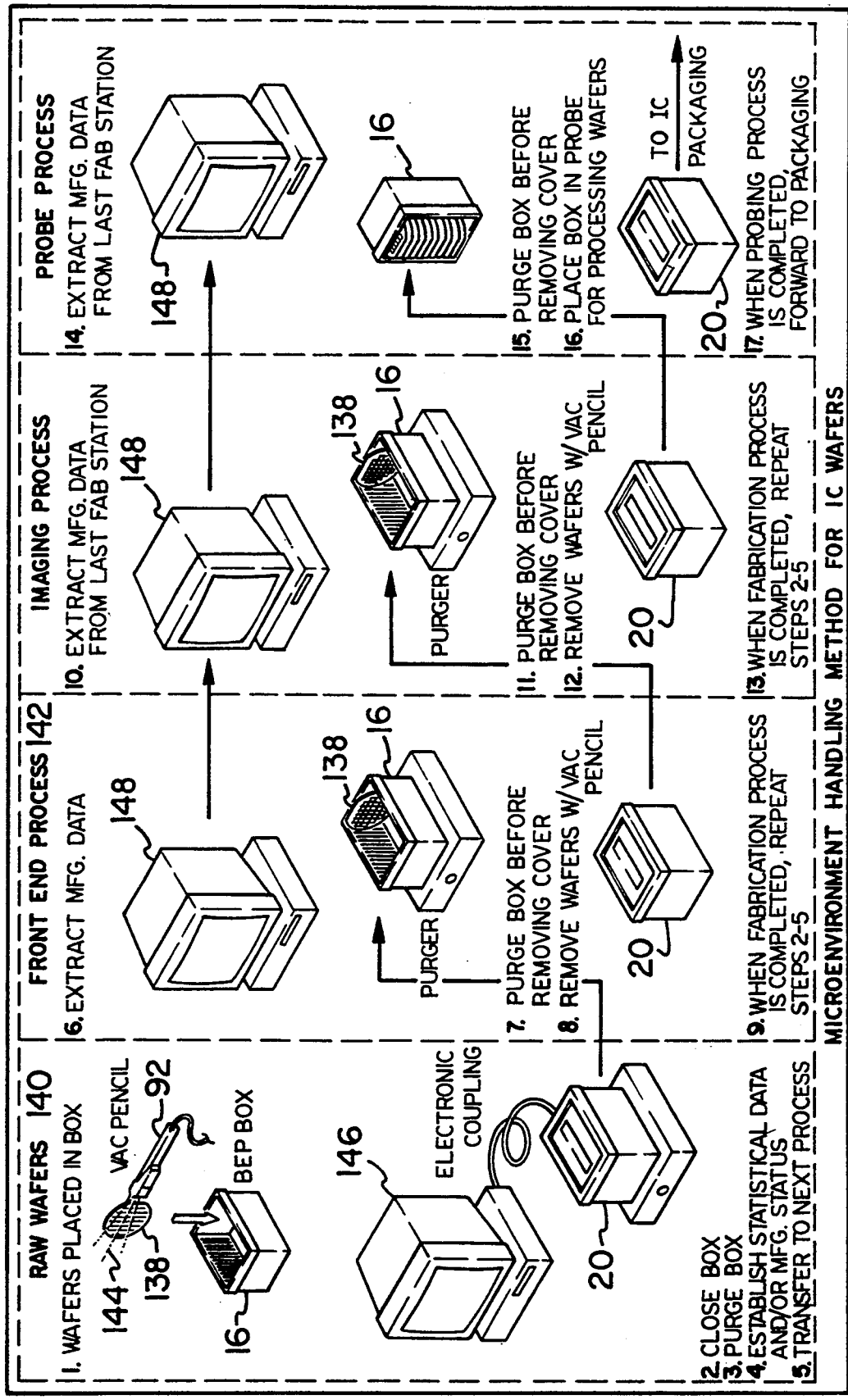
FIG. 10 is a diagrammatic illustration of a method according to the present invention.

Referring now to FIG. 10, a method 136 according to the present invention for transferring semiconductor wafers 138 from a first location 140 to a second location 142 in an airtight container 20 includes lifting each wafer by the vacuum pick-up and gas spray apparatus 92 and placing it into box 16 while spraying at least one surface 144, not shown in the illustration, of the wafer with ionized gas, then placing the cover onto the box, forming the airtight container and admitting ionized gas into the container while releasing gas from the container. The container is thus substantially purged of static charge. Airborne or gaseous contaminates and particulates should also be substantially reduced. The method also includes then collecting and storing data regarding the container and the wafers on semiconductor chip storage 86 by means of a computer 146, and transferring the container to the second location. Once the airtight container is at the second location, the stored data regarding the container and the wafers is read by a computer 148, and ionized gas is admitted into the container while gas is released from the container, once again substantially purging the container of static charge. The cover is then removed from the box, and each wafer is lifted from the box by a vacuum pick-up device and placed at the second location while spraying ionized gas over at least one of its surfaces.

One method according to the present invention includes transferring the container to a storage area, such as the storage rack of this invention, prior to transferring it to the second location, and periodically admitting ionized gas into the container while releasing gas from the container while it is in the storage area.

From the foregoing it will be seen that this invention is one well adapted to attain all of the ends and objects hereinabove set forth, together with other advantages which are inherent to the apparatus. As an example, the system of the present invention could be used for dry etching processes. Masked wafers inside a closed container can be uniformly exposed to an etching gas by means of the purger.

It will be understood that certain features and subcombinations are of utility and may be employed without reference to other features and subcombinations. This is contemplated by and is within the scope of the claims.

As many possible embodiments may be made of the invention without departing from the scope thereof, it is to be understood that all matter herein set forth or shown in the figures of the accompanying drawing is to be interpreted as illustrative and not in a limiting sense.

We claim:

1. A system for maintaining articles to be processed clean, comprising in combination:
   a boat for supporting the articles in an organized upright arrangement;
   a box for receiving the boat and the articles;
   a cover for mating with the box and forming a closed, airtight container;
   an inlet valve in the box for admitting a gas into the container;
   an outlet valve in the cover for venting gas from the container;
   a purger having an interface to the container and the inlet valve when the container is operably connected to the purger; and
   a supply of gas available to the purger wherein gas from the supply can be admitted into the container through the interface and the inlet valve when the container is operably connected to the purger through the interface.

2. A system according to claim 1 further comprising:
   a static charge monitor within the container when the container is operably connected to the purger; and
   a circuit operably connected to the static charge monitor when the container is operably connected to the purger for monitoring the static charge within the container.

3. A system according to claim 2 further comprising:
   a static charge monitor associated with the purger, adjacent to the exterior surface of the container when the container is operably connected to the purger; and
   a circuit for monitoring the static charge monitor exterior to the container, wherein the static charge monitor is operably connected to the monitoring circuit.

4. A system according to claim 3 wherein the box forms a generally rectangular bottom and four substantially upright, generally rectangular walls and the cover forms a generally rectangular top and four substantially downward, generally rectangular walls wherein the four walls of the cover mate with the four walls of the box to form a closed structure and wherein the inlet valve is in the bottom with a gas inlet to the interior of the container extending substantially the length of the bottom.

5. A system according to claim 4 further including electronic data storage affixed to the container for storing historic data about the container and its contents.

6. A system according to claim 1 wherein the box forms a generally rectangular bottom and four substantially upright, generally rectangular walls and the cover forms a generally rectangular top and four substantially downward, generally rectangular walls wherein the four walls of the cover mate with the four walls of the box to form a closed structure and wherein the inlet valve is in the bottom with a gas inlet to the interior of the container extending substantially the length of the bottom.

7. A system according to claim 6 further including an electronic data storage device affixed to the container for storing historic data about the container and its contents.

8. A system according to claim 1 further including an electronic data storage device affixed to the container for storing historic data about the container and its contents.

9. A system according to claim 1 wherein the purger interface includes a surface for supporting the container and the container is operably connected to the purger when it is placed on the supporting surface.

10. A system according to claim 1 further comprising a vacuum pick-up and gas spray apparatus for placing the articles to be processed into the boat, comprising in combination:
    a paddle forming a substantially flat surface for placing against an article to be picked up;
    a suction source;
    a suction nozzle open to the flat surface, operably connected to the suction source;
    a gas source; and
    a gas nozzle operably connected to the gas source and positioned for spraying gas from the source across the side of the paddle having the substantially flat pick-up surface.

11. A system according to claim 10 wherein the vacuum pick-up and gas spray apparatus further comprises:
    a housing suitable for being held in a user's hand;
    a power source providing low voltage, located outside of the housing;
    a circuit within the housing operably connected to the low voltage power source for generating a high positive voltage and a high negative voltage; and
    a pair of electrodes within the housing, one electrode electrically connected to the high positive voltage and the other electrode electrically connected to the high negative voltage, wherein the gas in travelling from the gas source to the gas nozzle passes over the pair of electrodes immediately upstream of the gas nozzle, forming a chamber for ionizing the gas spray prior to spraying the gas through the nozzle.

12. A system according to claim 11 wherein the vacuum pick-up and gas spray apparatus further comprises:
    a vacuum sense switch responsive to the suction level between the suction source and the suction nozzle, having at least a first position corresponding to the suction being at a level corresponding to an article being picked-up and a second position corresponding to no article being picked-up;
    a manual switch having at least a first position and a second position;
    a suction control valve operably between the suction source and the suction nozzle, responsive to the vacuum sense switch and the manual switch wherein the suction control valve is open when either the vacuum sense switch or the manual switch is in the first position and closed when both the vacuum sense switch and the manual switch are in the second position; and a gas control valve operably between the gas source and the gas nozzle, responsive to the vacuum sense switch and the manual switch wherein the gas control valve is open when either the vacuum sense switch is in the second position or the manual switch is in the second position and is closed when the vacuum sense switch and the gas control switch are both in the first position.

13. A system according to claim 10 wherein the vacuum pick-up and gas spray apparatus further comprises:

a vacuum sense switch responsive to the suction level between the suction source and the suction nozzle, having at least a first position corresponding to the suction being at a level corresponding to an article being picked-up and a second position corresponding to no article being picked-up;

a manual switch having at least a first position and a second position;

a suction control valve operably between the suction source and the suction nozzle, responsive to the vacuum sense switch and the manual switch wherein the suction control valve is open when either the vacuum sense switch or the manual switch is in the first position and closed when both the vacuum sense switch and the manual switch are in the second position; and a gas control valve operably between the gas source and the gas nozzle, responsive to the vacuum sense switch and the manual switch wherein the gas control valve is open when either the vacuum sense switch is in the second position or the manual switch is in the second position and is closed when the vacuum sense switch and the gas control switch are both in the first position.

14. A system according to claim 1 further comprising a gas spray apparatus for purifying the system and the articles to be processed, comprising in combination:

a housing suitable for being held in a user's hand;

a gas source located outside of the housing;

a gas nozzle located in the housing, operably connected to the gas source and positioned for spraying gas from the source to the outside of the housing;

a power source providing low voltage, located outside of the housing;

a circuit located within the housing operably connected to the low voltage power source for generating a high positive voltage and a high negative voltage;

a pair of electrodes located within the housing, one electrode electrically connected to the high positive voltage and the other electrode electrically connected to the high negative voltage, wherein the gas in travelling from the gas source to the gas nozzle passes over the pair of electrodes immediately upstream of the gas nozzle, forming a chamber for ionizing the gas spray prior to spraying the gas through the nozzle.

15. A system according to claim 14 wherein the gas spray apparatus further comprises:

a vacuum sense switch responsive to the suction level between the suction source and the suction nozzle, having at least a first position corresponding to the suction being at a level corresponding to an article being picked-up and a second position corresponding to no article being picked-up;

a manual switch having at least a first position and a second position;

a suction control valve operably between the suction source and the suction nozzle, responsive to the vacuum sense switch and the manual switch wherein the suction control valve is open when either the vacuum sense switch or the manual switch is in the first position and closed when both the vacuum sense switch and the manual switch are in the second position; and a gas control valve operably between the gas source and the gas nozzle, responsive to the vacuum sense switch and the manual switch wherein the gas control valve is open when either the vacuum sense switch is in the second position or the manual switch is in the second position and is closed when the vacuum sense switch and the gas control switch are both in the first position.

16. A system according to claim 1 further comprising:

a static charge monitor within the container;

a first electronic connector exterior to the container operably connected to the static charge monitor within the container;

a circuit within the purger for monitoring the static charge monitor within the container; and a second electronic connector associated with the purger operably connected to the static charge monitor, for mating with the first electronic connector whereby the static charge monitor is operably connected to the monitoring circuit when the container is operably connected to the purger.

17. A system according to claim 16 further comprising:

a static charge monitor associated with the purger, adjacent to the exterior surface of the container when the container is operably connected to the purger; and a circuit within the purger for monitoring the static charge monitor exterior to the container, wherein the static charge monitor is operably connected to the monitoring circuit.

18. A system according to claim 17 wherein the box has a generally rectangular bottom and four substantially upright, generally rectangular walls and the cover has a generally rectangular top and four substantially downward, generally rectangular walls wherein the four walls of the cover mate with the four walls of the box to form a closed structure and wherein the inlet valve is in the bottom with a gas inlet to the interior of the container extending substantially the length of the bottom.

19. A system according to claim 18 further including an electronic data storage device affixed to the container for storing historic data about the container and its contents.

20. A system for maintaining articles to be processed clean while being moved or stored, comprising in combination:

a plurality of transportable, closed, airtight containers for containing the articles;

an inlet valve in each container for admitting a gas into the container;

an outlet valve in each container for venting gas from the container;

a plurality of purgers, each purger having an interface which is connectable to one of the containers and the container's inlet valve when the container is operably connected to the purger;

a supply of gas available to the plurality of purgers wherein gas from the supply can be admitted into the plurality of containers through the interfaces and the inlet valves when the containers are operably connected to the purgers through the interfaces;

a plurality of static charge monitors, at least one static charge monitor within each container when the container is operably connected to the purger; and a plurality of circuits, at least one circuit within each purger operably connected to the static charge monitor when one container of the plurality is operably connected to the purger for monitoring the static charge within the container.

21. A system according to claim 20 further comprising:

a plurality of static charge monitors, at least one static charge monitor associated with each purger of the plurality, adjacent to the exterior surface of one container of the plurality when the container is operably connected to the purger; and a circuit within the purger for monitoring the static charge monitor exterior to the container, wherein the static charge monitor is operably connected to the monitoring circuit.

22. A system according to claim 21 further including a plurality of electronic data storage devices, at least one electronic data storage device affixed to each container for storing historic data about the container and its contents.

23. A system for maintaining articles to be processed clean while being moved or stored, comprising in combination:

a plurality of transportable, closed, airtight containers for containing the articles;

an inlet valve in each container for admitting a gas into the container;

an outlet valve in each container for venting gas from the container;

a plurality of purgers, each purger having an interface which is connectable to one of the containers and the container's inlet valve when the container is operably connected to the purger;

a supply of gas available to the plurality of purgers wherein gas from the supply can be admitted into the plurality of containers through the interfaces and the inlet valves when the containers are operably connected to the purgers through the interfaces; and a plurality of electronic data storage devices, at least one electronic storage device affixed to each container for storing historic data about the container and its contents.

24. A system for maintaining articles to be processed clean while being moved or stored, comprising in combination:

a plurality of transportable, closed, airtight containers for containing the articles;

an inlet valve in each container for admitting a gas into the container;

an outlet valve in each container for venting gas from the container;

a plurality of purgers, each purger having an interface which is connectable to one of the containers and the container's inlet valve when the container is operably connected to the purger; and a supply of gas available to the plurality of purgers wherein gas from the supply can be admitted into the plurality of containers through the interfaces and the inlet valves when the containers are operably connected to the purgers through the interfaces, wherein each purger interface includes a surface for supporting a container and a container is operably connected to the purger when it is placed on the supporting surface.

25. A transportable container for maintaining articles to be processed clean, comprising in combination:

a box forming a generally rectangular bottom and four substantially upright, generally rectangular walls;

a cover forming a generally rectangular top and four substantially downward, generally rectangular walls wherein the four walls of the cover mate with the four walls of the box to form a closed structure;

a seal between the box and the cover where the four walls of the cover mate with the four walls of the box to form an airtight structure;

an inlet valve for admitting a gas into the container;

an inlet distributor to distribute gas from the inlet valve to articles within the container;

an outlet valve for venting gas from the container, wherein the outlet valve is substantially positioned opposite to the inlet valve on the container; and an electronic data storage device affixed to the container for storing historic data about the container and its contents.

26. A vacuum pick-up and gas spray apparatus comprising in combination:

a paddle forming a substantially flat surface for placing against an article to be picked up;

a suction source;

a suction nozzle open to the flat surface, operably connected to the suction source;

a gas source;

a gas nozzle operably connected to the gas source and positioned for spraying the gas across the side of the paddle having the substantially flat pick-up surface.

27. A vacuum pick-up and gas spray apparatus according to claim 26 further comprising:

a housing suitable for being held in a user's hand;

a power source providing low voltage, located outside of the housing;

a circuit within the housing operably connected to the low voltage power source for generating a high positive voltage and a high negative voltage; and a pair of electrodes within the housing, one electrode electrically connected to the high positive voltage and the other electrode electrically connected to the high negative voltage, wherein the gas in travelling from the gas source to the gas nozzle passes over the pair of electrodes immediately upstream of the gas nozzle, forming a chamber for ionizing the gas spray prior to spraying the gas through the nozzle.

28. A vacuum pick-up and gas spray apparatus according to claim 27 further comprising:

a vacuum sense switch responsive to the suction level between the suction source and the suction nozzle, having at least a first position corresponding to the suction being at a level corresponding to an article being picked-up and a second position corresponding to no article being picked-up;
a manual switch having at least a first position and a second position;
a suction control valve operably between the suction source and the suction nozzle, responsive to the vacuum sense switch and the manual switch wherein the suction control valve is open when either the vacuum sense switch or the manual switch is in the first position and closed when both the vacuum sense switch and the manual switch are in the second position; and
a gas control valve operably between the gas source and the gas nozzle, responsive to the vacuum sense switch and the manual switch wherein the gas control valve is open when either the vacuum sense switch is in the second position or the manual switch is in the second position and is closed when the vacuum sense switch and the gas control switch are both in the first position.

29. A vacuum pick-up and gas spray apparatus according to claim 26 further comprising:
a vacuum sense switch responsive to the suction level between the suction source and the suction nozzle, having at least a first position corresponding to the suction being at a level corresponding to an article being picked-up and a second position corresponding to no article being picked-up;
a manual switch having at least a first position and a second position;
a suction control valve operably between the suction source and the suction nozzle, responsive to the vacuum sense switch and the manual switch wherein the suction control valve is open when either the vacuum sense switch or the manual switch is in the first position and closed when both the vacuum sense switch and the manual switch are in the second position; and
a gas control valve operably between the gas source and the gas nozzle, responsive to the vacuum sense switch and the manual switch wherein the gas control valve is open when either the vacuum sense switch is in the second position or the manual switch is in the second position and is closed when the vacuum sense switch and the gas control switch are both in the first position.

30. A gas spray apparatus comprising in combination:
a housing suitable for being held in a user's hand;
a gas source located outside of the housing;
a gas nozzle located in the housing, operably connected to the gas source and positioned for spraying gas from the source to the outside of the housing;
a power source providing low voltage, located outside of the housing;
a circuit located within the housing operably connected to the low voltage power source for generating a high positive voltage and a high negative voltage;
a pair of electrodes located within the housing, one electrode electrically connected to the high positive voltage and the other electrode electrically connected to the high negative voltage, wherein the gas in travelling from the gas source to the gas nozzle passes over the pair of electrodes immediately upstream of the gas nozzle, forming a chamber for ionizing the gas spray prior to spraying the gas through the nozzle.

31. A gas spray apparatus according to claim 30 further comprising:
a vacuum sense switch responsive to the suction level between the suction source and the suction nozzle, having at least a first position corresponding to the suction being at a level corresponding to an article being picked-up and a second position corresponding to no article being picked-up;
a manual switch having at least a first position and a second position;
a suction control valve operably between the suction source and the suction nozzle, responsive to the vacuum sense switch and the manual switch wherein the suction control valve is open when either the vacuum sense switch or the manual switch is in the first position and closed when both the vacuum sense switch and the manual switch are in the second position; and
a gas control valve operably between the gas source and the gas nozzle, responsive to the vacuum sense switch and the manual switch wherein the gas control valve is open when either the vacuum sense switch is in the second position or the manual switch is in the second position and is closed when the vacuum sense switch and the gas control switch are both in the first position.

32. A method for transferring semiconductor wafers from a first location to a second location in a airtight container including a box for receiving the wafers and a cover for mating with the box, comprising in combination the steps of:
lifting each wafer from the first location by means of a vacuum;
placing each wafer into the box;
placing the cover onto the box, forming the airtight container;
admitting ionized gas into the container while releasing gas from the container, whereby the container is substantially purged of static charge;
collecting and storing data regarding the container and the wafers onto electronic data storage which is affixed to the container; and
transferring the container to the second location.

33. A method according to claim 32 further including the steps of:
reading the stored data regarding the container and the wafers from the electronic data storage;
admitting ionized gas into the container while releasing gas from the container, whereby the container is substantially purged of static charge;
removing the cover from the box;
lifting each wafer by means of a vacuum; and
placing each wafer at the second location.

34. A method for transferring semiconductor wafers from a first location to a second location in an airtight container including a box for receiving the wafers and a cover for mating with the box, comprising in combination the steps of:
lifting each wafer from the first location by means of a vacuum;
placing each wafer into the box;
placing the cover onto the box, forming the airtight container;
admitting ionized gas into the container while releasing gas from the container, whereby the container is substantially purged of static charge;
transferring the container to the second location;

admitting ionized gas into the container while releasing gas from the container, whereby the container is substantially purged of static charge;

removing the cover from the box;

lifting each wafer by means of a vacuum; and placing each wafer at the second location.

35. A method for transferring semiconductor wafers from a first location to a second location in an airtight container including a box for receiving the wafers and a cover for mating with the box, comprising in combination the steps of:

lifting each wafer from the first location by means of a vacuum;

placing each wafer into the box;

placing the cover onto the box, forming the airtight container;

admitting ionized gas into the container while releasing gas from the container, whereby the container is substantially purged of static charge;

transferring the container to a storage area;

periodically admitting ionized gas into the container while releasing gas from the container while the container is in the storage area, whereby the container is periodically substantially purged of static charge;

transferring the container to the second location;

admitting ionized gas into the container while releasing gas from the container, whereby the container is substantially purged of static charge;

removing the cover from the box;

lifting each wafer by means of a vacuum; and placing each wafer at the second location.

36. A method for transferring semiconductor wafers from a first location to a second location in an airtight container including a box for receiving the wafers and a cover for mating with the box, comprising in combination the steps of:

lifting each wafer from the first location;

placing each wafer into the box;

spraying ionized gas across at least one surface of each wafer while it is being lifted from the first location and placed into the box;

placing the cover onto the box, forming the airtight container; and admitting ionized gas into the container while releasing gas from the container, whereby the container is substantially purged of static charge.

37. A method according to claim 36 further comprising the steps of:

collecting and storing data regarding the container and the wafers; and transferring the container to the second location.

38. A method according to claim 37 further including the steps of:

reading the stored data regarding the container and the wafers;

admitting ionized gas into the container while releasing gas from the container, whereby the container is substantially purged of static charge;

removing the cover from the box;

lifting each wafer from the box;

placing each wafer at the second location; and spraying ionized gas across at least one surface of each wafer while it is being lifted from the box and placed at the second location.

39. A method according to claim 36 further comprising the steps of:

transferring the container to the second location;

admitting ionized gas into the container while releasing gas from the container, whereby the container is substantially purged of static charge;

removing the cover from the box;

lifting each wafer by means of a vacuum; and placing each wafer at the second location.

40. A method according to claim 36 further comprising the steps of:

transferring the container to a storage area;

periodically admitting ionized gas into the container while releasing gas from the container while the container is in the storage area, whereby the container is periodically substantially purged of static charge;

transferring the container to the second location;

admitting ionized gas into the container while releasing gas from the container, whereby the container is substantially purged of static charge;

removing the cover from the box;

lifting each wafer by means of a vacuum; and placing each wafer at the second location.

41. A method for transferring a semiconductor wafer from a first location to a second location comprising in combination the steps of:

lifting the wafer from the first location; and spraying ionized gas across at least one surface of the wafer while it is being lifted.

42. A controlled mini-environment for semiconductor wafers, comprising in combination:

a substantially airtight container for the wafers;

an inlet valve for admitting gas into the container;

an outlet valve for venting gas from the container;

an interface to the container and the inlet valve;

a circuit for generating a high positive voltage and a high negative voltage;

a first electrode electrically connected to the high positive voltage;

a second electrode electrically connected to the high negative voltage, wherein gas travelling from the gas supply to the inlet valve passes over the electrodes and wherein the circuit, first electrode and second electrode form an ionization chamber in open communication with the interface; and a supply of gas which can be admitted into the container through the ionization chamber, interface and inlet valve, wherein the gas is ionized when it is admitted into the chamber.

* * * * *